United States Patent

Horiike et al.

[11] Patent Number: 6,096,176
[45] Date of Patent: *Aug. 1, 2000

[54] SPUTTERING METHOD AND A SPUTTERING APPARATUS THEREOF

[75] Inventors: Yasuhiro Horiike, Nerima-ku; Takayuki Fukasawa, Yamanashi, both of Japan

[73] Assignees: Tokyo Electron Limited, Tokyo-To; Tokyo Electron Yamanashi Limited, Yamanashi-Ken; Yasuhiro Horiike, Tokyo-To, all of Japan

[ * ] Notice: This patent issued on a continued prosecution application filed under 37 CFR 1.53(d), and is subject to the twenty year patent term provisions of 35 U.S.C. 154(a)(2).

[21] Appl. No.: 08/506,141

[22] Filed: Jul. 24, 1995

[30] Foreign Application Priority Data

Jul. 2, 1994 [JP] Japan .................................. 6-194952

[51] Int. Cl.[7] .................................................. C23C 14/34
[52] U.S. Cl. ............................... 204/192.17; 204/192.15; 204/192.22; 204/192.23; 204/298.06; 204/298.16; 204/298.19
[58] Field of Search .......................... 204/192.12, 298.09, 204/298.06, 298.07, 298.16, 298.19, 192.23, 192.22, 192.15, 192.17

[56] References Cited

U.S. PATENT DOCUMENTS

| 4,392,931 | 7/1983 | Manir et al. .................... 204/298.07 X |
| 4,824,546 | 4/1989 | Ohmi ................................. 204/298.06 |
| 4,849,081 | 7/1989 | Ross .................................... 204/192.15 |
| 4,990,229 | 2/1991 | Campbell et al. ............. 204/298.16 X |
| 5,122,251 | 6/1992 | Campbell et al. .................. 204/298.06 |
| 5,292,417 | 3/1994 | Kugler ............................... 204/192.13 |
| 5,409,587 | 4/1995 | Sandhu et al. ..................... 204/192.12 |
| 5,417,834 | 5/1995 | Latz ................................... 204/298.11 |
| 5,441,623 | 8/1995 | Lin ..................................... 204/298.09 |
| 5,478,609 | 12/1995 | Okamura ....................... 204/298.09 X |

FOREIGN PATENT DOCUMENTS 7-228968  8/1995  Japan .

OTHER PUBLICATIONS

Sadakuni et al., "Reactive Sputter deposition of SiO2 Film Employing Helicon Wave Plasma", Extended Abstract (The 41 st Spring Meeting, 1994); The Japanese Society of Applied Physics and Related Societies No. 2, Mar. 1994.

"Reactive Sputter Deposition of $SiO_2$ Film Employing Helicon Wave Plasma" Extended Abstract (The $41^{st}$ Spring Meeting, 1994); The Japanese Society of Applied Physics and Related Societies No. 2.

*Primary Examiner*—Rodney McDonald
*Attorney, Agent, or Firm*—Smith, Gambrell & Russell, LLP

[57] ABSTRACT

A target and a wafer are opposed to each other in a processing vessel in the form of a quartz tube whose internal pressure can be reduced. A low bias voltage is applied to the wafer while Helicon wave plasma of high density is generated between the target and the wafer by an antenna disposed on the circumference of the processing vessel. The wafer is positioned near and outside a lower boundary of a region of the plasma. Deposition seeds from the target are ionized in the plasma region and accelerated vertically to be incident on the wafer and are deposited first on the bottoms of the grooves in a surface of the wafer. In burying deposition seeds in grooves and holes of high aspect ratios which are formed in the surface of the wafer, the deposition seeds can be deposited first on the bottoms without occurrence of voids.

7 Claims, 4 Drawing Sheets

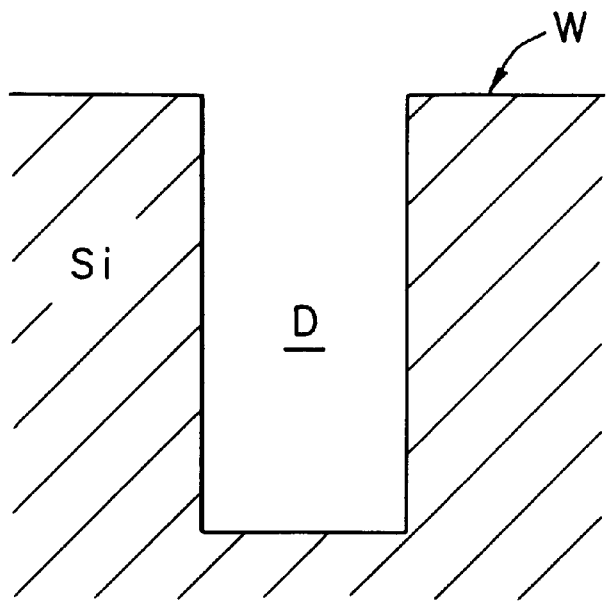
F I G. 3
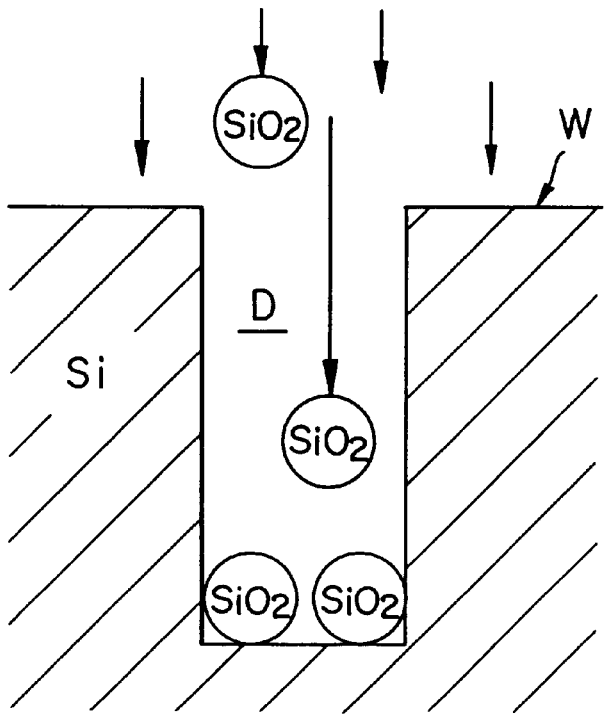
F I G. 5

SPUTTERING METHOD AND A SPUTTERING APPARATUS THEREOF

BACKGROUND OF THE INVENTION

The present invention relates to a sputtering method and sputtering apparatus for the sputtering method.

Here the sputtering is explained in a semiconductor device fabrication process. In forming electrodes and patterns on objects to be processed, such as semiconductor wafers, forming insulating films, etc. for device isolation, conventionally the objects to be processed, required electrodes, and targets of pattern materials and insulation materials are opposed to each other in a processing chamber with a required low pressure atmosphere being established therein, and deposition particles (deposition seeds) sputtered from the targets by glow discharges, etc. are deposited on the objects to be processed.

Recently as semiconductor devices are integrated higher, semiconductor device fabrication processes are required to have techniques for more micronized processing with high precision. For example, processing for internal wiring of a device requires to fill grooves of a high aspect ratio which have small openings and a large depth, with a required wiring deposition seed or insulation deposition seed.

In the conventional sputtering method and system, in such case, deposition seeds sputtered from a target by glow discharges or others do not have a uniform sputtering direction. That is, ratios of vertical components and horizontal components of the sputtered particles are various. In depositing the deposition seeds first on the bottoms of grooves or holes of a high aspect ratio formed in the surfaces of the objects to be processed, more of the deposition seeds are adversely deposited on the peripheral parts of the grooves and holes. As a result, voids occur in the bottoms of the grooves and holes and inside the grooves and holes, which may cause wiring breakage and defective insulation.

To prevent such occurrence, it is preferred to constrain the deposition seeds sputtered toward the objects to be processed to cause them to vertically enter the grooves and holes, decreasing horizontal the component of the deposition seeds, to be deposited there. To this end has been proposed a method by which the deposition seeds sputtered from the target are constrained by a collimator having, e.g., a plurality of vertical circular through-holes or vertical honeycomb-shaped through-holes disposed between the target and the objects to be processed so as to vertically enter the objects to be processed. This method, however, decreases number of the deposition seeds which enter the collimator, with results that deposition rates are lowered, and deposits take place on the collimator itself due to clogging, and the deposits may peel into particles and contaminate the interior of the processing chamber.

SUMMARY OF THE INVENTION

The present invention was made in view of the above-described problems. An object of the present invention is to provide a sputtering method which can realize sputtering on objects to be processed with good vertical anisotropy, and a sputtering system for the method which can ensure deposition of deposition seeds in grooves and holes of devices having high aspect ratios.

The conventional sputtering methods have used the so-called parallel plate plasma systems, magnetron sputtering systems, etc., which have relatively low plasma densities. Many of molecules and atoms to be deposition seeds which have been sputtered from the targets are neutrons. This causes the above-described problems.

The sputtering method according to the present invention uses a system which basically generates high density plasma, such as Helicon wave plasma, ERC plasma, inductively coupled plasma, etc. Furthermore, the deposition seeds are effectively ionized by the high density plasma to be incident vertically on objects to be processed to be deposited there.

The sputtering method according to the present invention wherein a target is opposed to an object to be processed in a processing vessel whose internal pressure can be reduced, a gas is introduced into the processing chamber, plasma being generated to deposit deposition seeds from the target, or deposition seeds combining particles from the target and said gas on the object to be processed is characterized in that the plasma is suitably generated by antenna means, the target being located at least in a region of the plasma, the object to be processed is located outside and near a boundary of the plasma region, a bias voltage is applied to the object to be processed.

The plasma generated by the antenna means is, e.g., Helicon wave plasma, ERC plasma, inductively coupled plasma.

The sputtering system according to the present invention wherein a target and an object to be processed are opposed in a substantially cylindrical processing vessel whose internal pressure can be reduced, a gas is introduced in the processing vessel, plasma being generated to deposit deposition seeds from the target, or deposition seeds combining particles from the target and the gas on the object to be processed is characterized in that the processing vessel is substantially cylindrical, the plasma is generated by suitable antenna means, the gas is introduced at one axial end of the processing vessel and exhausted at the other axial end of the processing vessel. the object to be processed is positioned upstream of flows of the gas, the target is positioned downstream of the gas flow, and a bias voltage is applied to the object to be processed.

According to the sputtering method of the present invention, Helicon wave plasma, ECR plasma and inductively coupled plasma, etc. generated by the antenna means are high density plasma. Deposition seeds of molecules and atoms dissociated from the target by the sputtering are ionized during passage through the high density plasma.

The ionized active deposition seeds are accelerated vertically to an object to be processed and deposited on the surface of the object to be processed by applying a bias voltage to the object to be processed. This does not lower deposition rates.

In the present invention, an object to be processed is located near and outside a boundary of the plasma region. The object to be processed is free from influence of the plasma itself, e.g., unintended etching.

BRIEF DESCRIPTION OF THE DRAWINGS

FIG. 3 is an enlarged vertical sectional view of a groove of a high aspect ratio formed in the surface of a semiconductor wafer, an object to be processed.

FIG. 5 is an explanatory view of incidence and deposition of SiO$_2$ by the sputtering system of FIG. 1 on the groove in the wafer shown in FIG. 3.

DETAILED DESCRIPTION OF THE PREFERRED EMBODIMENTS

[First Embodiment]

Figure 1:
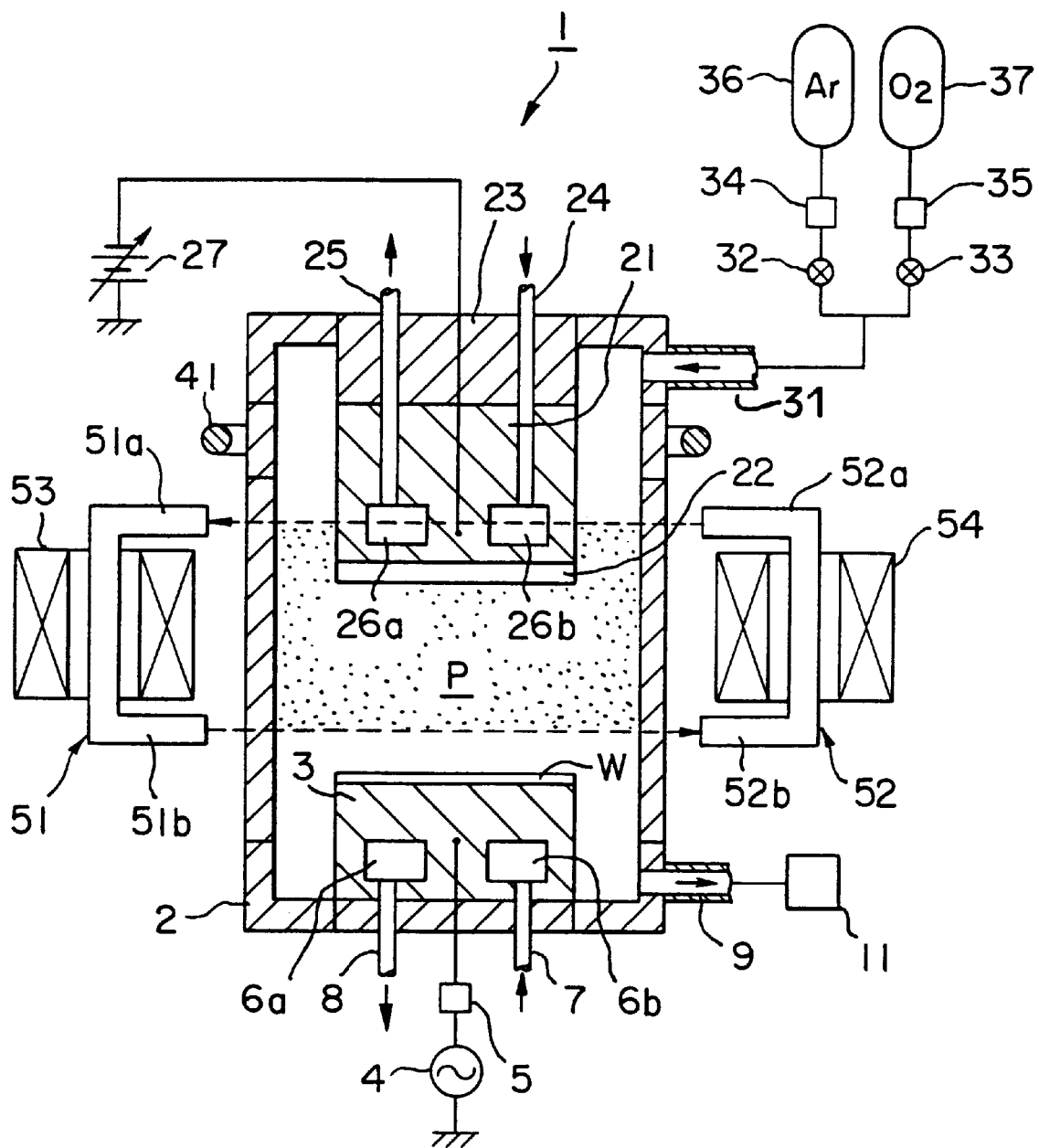
FIG. 1 is a schematic vertical sectional view of the sputtering system according to a first embodiment of the present invention.

A first embodiment of the sputtering method and a sputtering apparatus for the sputtering method will be explained with reference to the drawings. FIG. 1 is a schematic sectional view of the sputtering apparatus 1 according to the first embodiment. As shown, a processing vessel 2 of the sputtering apparatus 1 comprises a substantially cylindrical quartz tube (or tubes made of a combination of alumina, alumilite or ceramic materials). As shown, the processing vessel 2 may be divided in, e.g., four sections. An object to be sputtered, e.g., a semiconductor wafer W (hereinafter called "wafer" of, e.g., 8 inch- or 12 inch-diameter) is held on a susceptor 3 of an electrically conductive material (e.g., aluminium) disposed on the bottom of the processing vessel 2 by, e.g., static electric chuck (not shown). The susceptor 3 has the outer periphery coated with quartz.

The susceptor 3 provides a lower electrode of the sputtering apparatus, and a bias voltage of, e.g., a 100 kHz–13.56 MHz radio-frequency is applied to the susceptor 3 from an radio-frequency (RF) generator 4 disposed outside the processing vessel 2 through matching means 5. Suitable spaces 6a, 6b are formed in the susceptor 3, and cooling water of, e.g., the room temperature (20–25° C.) is circulated through the spaces 6a, 6b through an introduction pipe 7 and an discharge pipe 8. The wafer W is cooled and maintained at a required temperature. The susceptor 3 is movable up and down by suitable means.

An exhaust pipe 9 is provided near the bottom of the processing vessel 2 and is communicated to exhaust means 11, such as a vacuum pump. The exhaust means 11 is operated to evacuate the interior of the processing vessel 2 to an optional lower pressure of 0.1 mm Torr–10 Torr.

On the other hand, an upper electrode 21 is disposed on the top of the interior of the processing vessel 2. A target 22 is disposed on the underside of the upper electrode 21 opposed to the susceptor 3. In the present embodiment the target is made of an Si material. The upper electrode 21 is supported movably up and down in the processing vessel 2 by a support member 23. Cooling water is circulated in cooling spaces 26a, 26b in the upper electrode 21 through an introduction pipe 24 and a discharge pipe 25 provided through the support member 23, whereby the target 22 is cooled to a required temperature.

A required negative bias DC voltage of, e.g., 300 V is applied to the upper electrode 21 from a DC current source 27 disposed outside the processing vessel 2.

A processing gas feed pipe 31 is provided near the top of the processing vessel 2. The processing gas feed pipe 31 is connected to processing gas feed sources 36, 37 through valves 32, 33 and mass flow controllers 34, 35. In the first embodiment, the processing gas source 36 is for Ar gas, and the processing gas source 37 is for O$_2$ gas.

Figure 2:
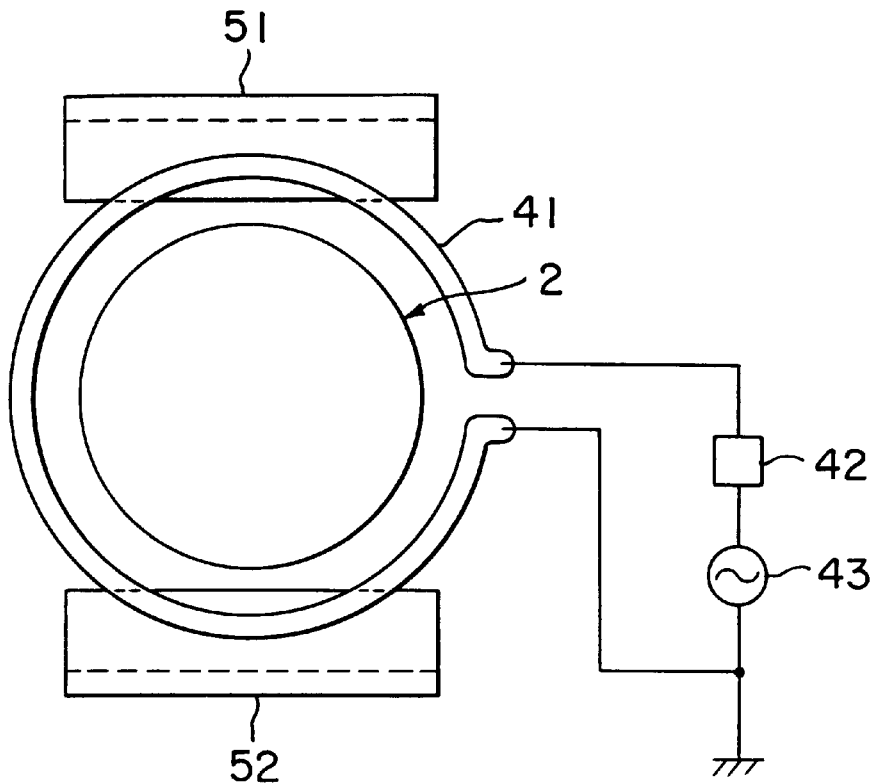
FIG. 2 is a plan view of the antenna used in the sputtering system of FIG. 1.

A loop antenna 41 for generating is disposed on an upper circumferential part of the processing vessel 2 by suitable means. A radio-frequency of, e.g., 13.56 MHz is applied from the RF generator 43 to the antenna 41 through the matching means 42. As shown in FIGS. 1 and 2, yokes 51, 52 having substantially bracket-shaped vertical section are disposed on that of the outside circumference of the processing vessel 2 between the antenna 41 and the susceptor 3 with the openings thereof opposed to each other. Coils 53, 54 are wound on the respective yokes 51, 52 to provide electromagnets. When current flows from an electric power source (not shown) through the coils 53, 54, magnetic fluxes (indicated by the chain lines in FIG. 1) are formed respectively between the horizonal arms 51a, 52a of the yokes 51, 52 and between the horizonal arms 51b, 52b, and a magnetic field is formed inside the processing vessel 2. In the first embodiment the yokes 51, 52 have the same shape and size and are made of cold-rolled steel plate (SPCC) of high permeability.

The material of the yokes is not limited to SPCC and may be made of materials of high permeability. It is not essential that two yokes are opposed to each other, and a permanent magnetic ring, for example, may be used in place of the two yokes.

The sputtering apparatus according to the first embodiment has the above-described structure. Burying an SiO$_2$ insulating film into a groove D of a high aspect ratio formed in the surface of a wafer will be explained. First the interior of the processing vessel 2 is evacuated by evacuation means 11 in FIG. 1. Ar gas is fed from the processing gas source 36, and O$_2$ gas is fed from the processing gas source 37. The interior of the processing vessel 2 is retained at a reduced atmosphere of 5 mmTorr. A gas flow rate ratio of the Ar gas and O$_2$ gas is 80% of Ar gas and 20% of O$_2$ gas.

A radio-frequency bias is applied to the susceptor 3 from the RF generator 4 while a DC voltage (negative potential) is applied to the target 22 from the DC current source 27. Radio-frequencies are applied to the antenna 41 to generate Helicon waves and generate plasma of a high density and a high sputtering rate in the processing vessel 2.

Figure 4:
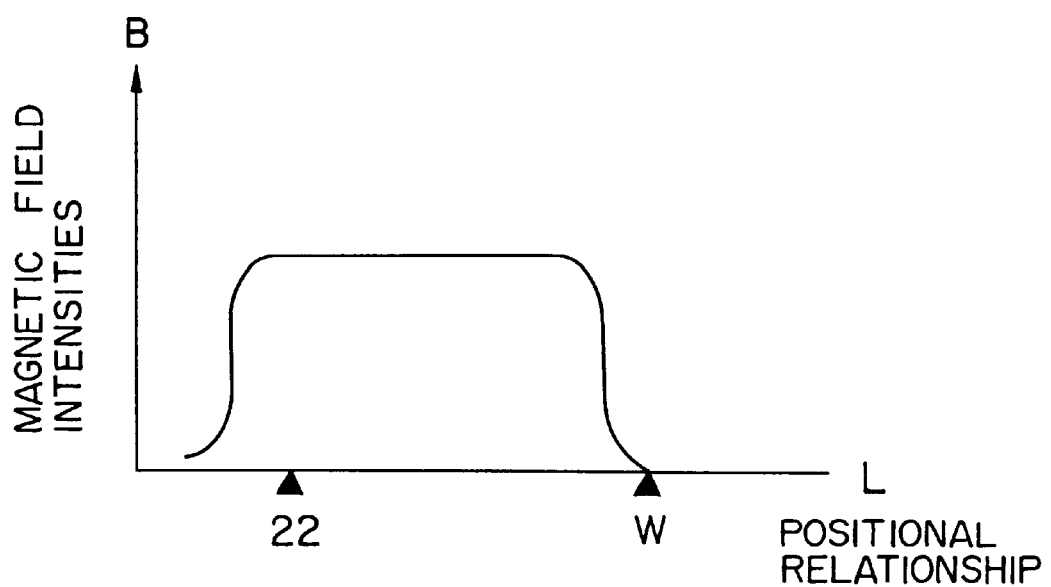
FIG. 4 is a graph of magnetic field intensities formed between the target and a wafer in the sputtering system of FIG. 1.

On the other hand, the coils 53, 54 are energized to form a magnetic field in a set region of the interior of the processing vessel 2. A positional relationship (L) between magnetic field intensities (B) obtained at this time, and the target and the wafer W is as shown in FIG. 4. With such magnetic field formed in the processing vessel 2, the generated plasma is confined in the magnetic field, forming a plasma region P as shown in FIG. 1.

Then Ar gas particles in the processing gas are dissociated toward the target of an Si material. Si particles are sputtered from the target 22 and bonded with O$_2$ in the processing gas, and deposition seeds SiO$_2$ are formed.

The plasma region P has high density plasma generated by Helicon waves, and most of the generated SiO$_2$ is ionized during passage through the plasma region P. On the other hand, a bias is applied to the wafer W, an object to be processed from the RF generator 4, and the deposition seeds SiO$_2$ are accelerated vertically to the processing surface of the wafer W.

As shown in FIG. 5, the deposition seeds SiO$_2$ vertically enter grooves D formed in the surface of the wafer W and are deposited first on the bottoms of the grooves.

Even in a case that the grooves D in the wafer W have a high aspect ratio which have a large depth and a small opening, the deposition seeds SiO$_2$ can be deposited first on the bottoms of the grooves D. Accordingly there is no risk that the buried SiO$_2$ may have voids. The first embodiment does not use a collimator, and deposition rates are not lowered.

Considering the ionization of the deposition seeds in the above-described processing, it is necessary to enhance the ionization during passage of the deposition seeds for more deposition seeds. In the sputtering apparatus 1 according to the present invention, the yokes 51, 52 are adjusted to suitably set a width (an axial length of processing vessel 2) of the plasma region P, whereby the ionization can be sufficient.

A width of the plasma region P (an axial length of the processing vessel 2), more precisely a length from the target 22 to the lower boundary of the plasma region P along the axis of the processing vessel 2 which is some to 10 times an average free travel of the deposition seeds makes it possible to increase the ionization ratio of the deposition seeds some to several 10 times larger than those of the conventional method during passage through the Helicon wave plasma. Intended anisotropic deposition can be achieved. The generated plasma is of Helicon waves, which is effective for the ionization of the deposition seeds.

The wafer W, an object to be processed is not located in the plasma region P (1–2 cm apart from the lower boundary of the plasma region P) as shown in FIG. 1 and is kept from exposure to the plasma. The grooves D in the surface of the wafer W are not etched by the plasma itself.

A bias voltage is applied to the wafer W from the RF source 4, and non-ionized deposition seeds may be deposited on the peripheral parts of the openings of the grooves D in the wafer W but can be peeled off. Accordingly the deposition seeds can be deposited in the grooves D without hindering entrance of the depositions seeds into the grooves D and without occurrence of voids.

In the above-described processing, an insulating pattern of deposition of $SiO_2$ is formed in the grooves D formed in the surface of the wafer W by using $SiO_2$ as the deposition seeds. The sputtering apparatus 1 according to the first embodiment is applicable to other processing using other processing gases and targets.

For example, the sputtering apparatus according to the first embodiment is applicable to contact holes, using Si as the target 22 and a mixed gas of Ar gas and $N_2$ gas as the processing gas, and deposition seeds of $Si_3N_4$ can be deposited in grooves and holes in the surface of an object to be processed. By using Ti as the target 22 and Ar gas and $N_2$ gas as the processing gas, TiN can be deposited in grooves and holes in the surface of an object to be processed.

In either case, deposition of high vertical incidence ratios can be achieved as in the first embodiment using $SiO_2$ as the deposition seeds, and $Si_3N_4$ and TiN can bury the grooves and holes, starting deposition on the bottoms of the grooves and holes. Accordingly even when the grooves and holes have high aspect ratios, the deposition without voids can be achieved.

In other cases, CF gases, such as $C_4F_8$, $CF_4$, etc. are used as the processing gas, and the deposition seeds $CF^+_{x(x>1)}$ can be incident vertically on an object to be processed. Intended deposition can be achieved. In this case, it is preferable to apply a lower bias voltage to the object to be processed than in the first embodiment.

In cases, for example, that electrically conductive materials, such as Al-based materials, and Cu-based materials are deposited in grooves and holes in the surfaces of, e.g., wafers W to bury the same, the antenna 41 of the sputtering apparatus 1 according to the first embodiment is disposed inside the processing vessel 2, and the antenna 41 is made of the same electrically conducting materials. Even when the electrically conductive materials, such as Al-based and Cu-based materials are deposited on the inside surface of the processing vessel 2 and the antenna 41, the function of the antenna 41 is not impaired, and plasma of high density can be generated inside the processing vessel 2.

In the sputtering apparatus 1 according to the first embodiment, the yokes 51, 52 are used to restrict the plasma region P, but the present invention does not essentially include such means to be practiced.

[Second Embodiment]

Figure 6:
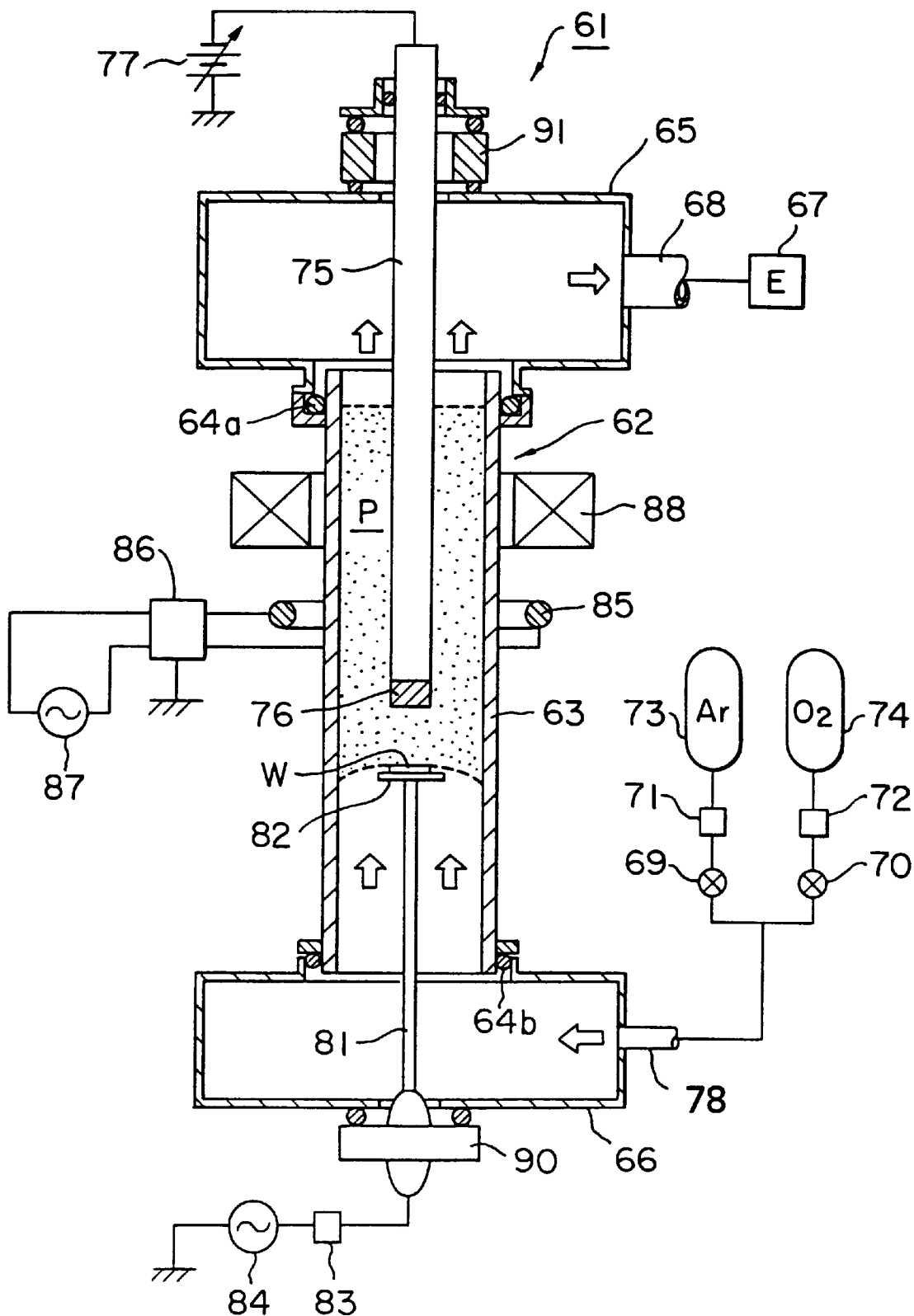
FIG. 6 is a schematic vertical sectional view of the sputtering system according to a second embodiment of the present invention.

FIG. 6 is a schematic view of the sputtering apparatus 61 according to a second embodiment of the present invention which does not include the yokes of the first embodiment. A processing vessel 61 of the sputtering apparatus 61 according to the second embodiment comprises a quartz tube 63 of, e.g., a 60 mm-diameter and a 50 cm-length, and an exhaust chamber 65 and an gas feed chamber 66 provided respectively on the top and the bottom of the quartz tube 63 through respective seal members 64a, 64b (e.g., O-rings). The exhaust chamber 66 has an exhaust pipe 68 communicated with exhaust means 67. The gas feed chamber 66 has a gas feed pipe 78 communicated with processing gas sources 73, 74 through valves 69, 70 and mass flow controllers 71, 72. In the sputtering apparatus 61 according to the second embodiment as well, the processing gas source 73 is for Ar gas, and the processing gas source 74 is for $O_2$ gas.

An upper electrode 75 is provided on the upper inside of the quartz tube 63 and is passed air-tight through the exhaust chamber 65. A target 76 of single crystal Si is adhered with In to a water cooling base on the bottom of the upper electrode 75. DC voltage (negative potential) is applied to the upper electrode 75 from an outside DC power source 77. The upper electrode 75 has an upper end portion supported by an insulation terminal 91 of Teflon.

On the other hand, a lower electrode 81 is provided lower in the quartz tube 62, opposed to the upper electrode 75 and is passed air-tight through the gas feed chamber 66. A base 82 is provided on the upper end of the lower electrode 81. An Si wafer W, an object to be processed is mounted on the base 82. A distance between the base 82 and the target 76 is set at, e.g., 3 cm. RF of 100 kHz is applied to the lower electrode 81 from an RF generator 84 through matching means 83 and an input terminal 90.

An antenna 85 is disposed on the outside circumference of the quartz tube 63 at a position 4 cm, for example, upper of the target 76. The antenna 85 has a one-wind loop and is connected to an RF generator 87 through matching means 86. When radio-frequency of 13.56 MHz is supplied to the antenna 85 from the RF generator 87, plasma of Helicon waves is generated in the quartz tube 63. A coil 88 is provided upper of the antenna 84 for forming a magnetic field.

The sputtering apparatus 61 according to the second embodiment of the present invention has the above-described structure. Then described is deposition of $SiO_2$ in grooves formed in the surface of the wafer W. First, 80% of Ar gas and 20% of $O_2$ gas are introduced into the quartz tube 63, and the interior of the quartz tube 63 is set at a 5 mmTorr reduced pressure. A magnetic filed intensity generated by the coil 86 is set at 180 Gauss, and an RF power is set at 1.2 kW. A voltage of −300 V is applied to the upper electrode 75, and an RF bias of 100 kHz/50 V is applied to the lower electrode 81.

Then, as shown in FIG. 6, Helicon wave plasma of high density ($1 \times 10^{12}$ $cm^{-3}$) is generated in the quartz tube 63, and the lower boundary of the plasma region P can be set immediately above the wafer W because of flows of the mixed gas of the Ar gas and the $O_2$ gas introduced from the gas feed chamber 66 below the wafer W.

In this state sputtering is conducted, and as in the sputtering apparatus 1 according to the first embodiment, the deposition seeds, $SiO_2$ are ionized during passing through the plasma region P and accelerated vertically into the grooves in the surface of the wafer W and deposited there.

Actually under these conditions, sputtering was conducted on an Si semiconductor wafer by the use of the sputtering apparatus 61. $SiO_2$ could be buried without voids in grooves of, e.g., a 1.2 μm-width and a 3 μm-depth. A deposition rate in this case was about 1000 Å/min. Thus, $SiO_2$ can be buried without voids in the grooves of the above-described high aspect ratio without impairing the deposition rate.

To achieve this operation, a bias voltage applied to the lower electrode 81 can be as low as 50 V, and there is no risk of damaging the wafer W.

In the above-described first and the second embodiments, the sputtering is conducted on semiconductor wafers as objects to be processed. The present invention is applicable to the sputtering of other objects to be processed, e.g., LCD substrates.

According to the sputtering method and apparatus of the present invention, molecules and atoms dissociated from the target, the deposition seeds, are ionized during passage through the high density plasma and accelerated vertically to an object to be processed to be deposited on the surface of the object to be processed. Accordingly the deposition starts on the bottoms of fine grooves and holes, and the buried grooves and holes are free from voids. Consequently there is no risk that defective wirings having defective connections and defective insulation may occur in fine grooves and holes in, e.g., wafers.

In the conventional method using collimators, higher deposition rates can be achieved without occurrence of deposition on the collimators. There is no risk that objects-to-be-processed themselves may be damaged by the plasma.

What is claimed is:

1. A sputtering method comprising the steps of:

disposing a target and an object to be processed in opposition to the target in a processing vessel whose internal pressure can be reduced, and introducing a gas into the processing vessel so that plasma is generated to deposit deposition seeds on the object to be processed;

wherein the deposition seeds comprise (a) particles from the target, or (b) a combination of the particles and the gas, wherein the plasma is generated by antenna means, the target is located at least in a region of the plasma, the object to be processed is located outside and next to a boundary of the plasma region, and a bias voltage is applied to the object to be processed, and wherein a magnetic field is formed in the processing vessel, the boundary of the plasma region in the processing vessel on the side of the object to be processed is so restricted that the object to be processed is located outside the plasma region, wherein the plasma is formed between a pair of boundaries which are perpendicular to a line connecting a center of the target and a center of the object to be processed, the target is held between the pair of boundaries, and the object to be processed is held outside the plasma region, and wherein the magnetic field defines the boundaries of the plasma region.

2. The sputtering method according to claim 1, wherein the plasma is formed between an upper boundary and a lower boundary, the target is held below the upper boundary and subjected to the plasma, and the object to be processed is held below the lower boundary and spaced from the plasma.

3. The sputtering method according to claim 1, wherein the generated plasma has an electron density of above $10^{-11}$ $cm^{-3}$.

4. The sputtering method according to claim 3, wherein the plasma is high density plasma, deposition seeds are ionized in the high density plasma to anisotropically deposit an insulating film or films of Al, Cu, Pt, TiN on bottoms of grooves in a surface of the object to be processed.

5. A sputtering method for using sputtering by plasma generated by introduction of a gas to deposit deposition seeds from a target and said gas on an object to be processed, comprising the steps of:

disposing a Si target to which negative DC potential is applied in a tube, disposing a Si object to be processed to which radio-frequency electric power is applied, in opposition to the target, generating plasma in the tube by Helicon waves, confining the generated plasma in a certain region by a magnetic filed generated by a coil so that the target is positioned in the region of the plasma and the object to be processed is positioned outside and next to a boundary of the plasma region, and introducing a mixed gas of oxygen and argon into the tube to deposit $SiO_2$ in grooves in a surface of the object to be processed, wherein the plasma is formed between a pair of boundaries which are perpendicular to a line connecting a center of the target and a center of the object to be processed, the target is held between the pair of boundaries, and the object to be processed is held outside the plasma region wherein the magnetic field defines the boundaries of the plasma region.

6. The sputtering method according to claim 5, wherein the plasma is formed between an upper boundary and a lower boundary, the target is held below the upper boundary and subjected to the plasma, and the object to be processed is held below the lower boundary and spaced from the plasma.

7. The sputtering method according to claim 5, wherein the generated plasma has an electron density of above $10^{11}$ $cm^{-3}$.

* * * * *